United States Patent [19]

Pfaff

[11] Patent Number: 4,618,199
[45] Date of Patent: Oct. 21, 1986

[54] LOW INSERTION FORCE SOCKET

[76] Inventor: Wayne K. Pfaff, 1316 Savannah, Irving, Tex. 75062

[21] Appl. No.: 771,104

[22] Filed: Aug. 30, 1985

[51] Int. Cl.⁴ .......................................... H01R 13/635
[52] U.S. Cl. ................................. 339/74 R; 339/75 M
[58] Field of Search ............ 339/74 R, 75 M, 75 MP, 339/17 CF

[56] References Cited

U.S. PATENT DOCUMENTS

| 4,217,024 | 8/1980 | Aldridge et al. | 339/17 CF |
| 4,350,402 | 9/1982 | Douty et al. | 339/74 R |
| 4,422,703 | 12/1983 | Christensen et al. | 339/74 R |
| 4,496,205 | 1/1985 | Christensen et al. | 339/74 R |

FOREIGN PATENT DOCUMENTS 3307121  9/1984  France ........................... 339/75 MP Primary Examiner—John McQuade
Attorney, Agent, or Firm—Kanz, Scherback & Timmons

[57] ABSTRACT

Disclosed is a socket comprising a base member and a top plate member. Substantially U-shaped pin connectors are mounted in the top face of the base member and include a contact pin extending through the base member. The top plate member is aligned substantially parallel with and spaced from the base member and adapted to move toward and away from the base member. The top plate member includes an aperture aligned with each U-shaped pin connector and includes a wedge-shaped body positioned to spread the legs of each U-shaped pin connector when the top plate portion is moved toward the base member.

10 Claims, 6 Drawing Figures

LOW INSERTION FORCE SOCKET

This invention relates to sockets or receivers for electronic device packages. More particularly, it relates to test and/or burn-in sockets for receiving electronic devices packaged in dual in-line pin packages.

Semiconductor device chips are conventionally packaged in various package configuratons depending upon the circuit application, circuit function, anticipated environmental conditions and requirements, costs, etc. One of the more common package designs used for such electronic devices is a package configuration known as a dual in-line pin package, more commonly referred to as the DIP package. In the DIP package leads extend from the opposite sides of an encapsulating package and are turned downward ninety degrees so that the leads extend in two in-line parallel rows.

For many circuit applications each completed device must be tested for performance prior to sale. Furthermore, many circuit applications require that the device be tested under various adverse environmental conditions under normal or exaggerated test loads. Such tests are commonly conducted on a plurality of devices simultaneously by inserting the devices in sockets or receptacles arranged on a test or burn-in board and exposing the burn-in board and the devices thereon to temperature and other environmental conditions. In some cases the electronic devices are also subjected to electrical loads during burn-in to stress the devices both electrically as well as environmentally. The devices are then removed for further evaluation, testing, grading and/or sale.

It will be apparent that the sockets used on the burn-in and test boards must be capable of withstanding all of the test conditions to which the DIP is to be subjected. Furthermore, the socket should be capable of accepting a variety of devices and must also withstand repeated use. Good electrical and physical contact between the conductive pin receptacles and the device leads is, of course, absolutely essential.

Ordinarily the contact receptacles are spring loaded fingers which exert mechanical pressure on the leads to form electrical contact. Obviously, the mechanical pressure exerted by the contact finger must be overcome to either insert or remove a DIP from a socket. The mechanical force for each lead is thus multiplied by the number of leads. When using high pin count DIPs, the physical force required to insert or remove a DIP becomes substantial. Thus, repeated loading and unloading of burn-in boards can become an extremely physical task.

Each reuse of a socket also causes wear to the contact fingers and subjects each socket to possible damage. Furthermore, forcing the leads of a DIP into the socket also risks damage to the DIP. For these and other reasons, many test and burn-in sockets have been designed to include mechanical means to spread the contact fingers in the socket prior to insertion of the DIP leads and then release the spring fingers to grip the leads after the DIP has been inserted. The process is reversed for removing the DIP. These devices are usually referred to as "low insertion force" or "zero insertion force" sockets. While such mechanical finger spreaders solve some of the afore-mentioned problems, they create problems of their own. For example, the mechanical spreaders are generally large and cumbersome, thus causing the socket to occupy excessive valuable space on the board.

The mechanical spreader devices are also exposed to the same adverse environmental conditions as the socket and thus are expensive to fabricate and are also subject to excessive wear. Such devices usually involve a large number of interacting parts, all of which add to the cost of manufacture and decrease reliability. It is therefore highly desirable that a test and/or burn-in socket be provided which avoids the problems of the prior art but which provides the advantage of reducing risks of damage to the DIP and the socket while reducing the physical force required to load and unload the sockets.

In accordance with the present invention, an extremely simplified socket is provided which provides all the advantages of low zero insertion force sockets but which avoids the primary problems of the prior art devices. In its basic embodiment, the socket of the invention is comprised of only two parts in addition to the metal connector pins. The pins are firmly held in a base part and a top plate fits over the spring fingers of the contact pins. Wedges formed in the top plate spread the spring fingers when the top plate is moved toward the base. The socket thus has effectively only one moving part which is not subject to wear or misalignment and the plan outline of the socket is no larger than that required to accommodate the lead configuration of the DIP. Since only the top plate portion is moveable and its movement is vertical, the socket is readily adaptable to use with simple mechanical automated loading and unloading equipment.

Other features and advantages of the invention will become apparent from the following detailed description taken in connection with the appended claims and attached drawings in which:

Figure 1:
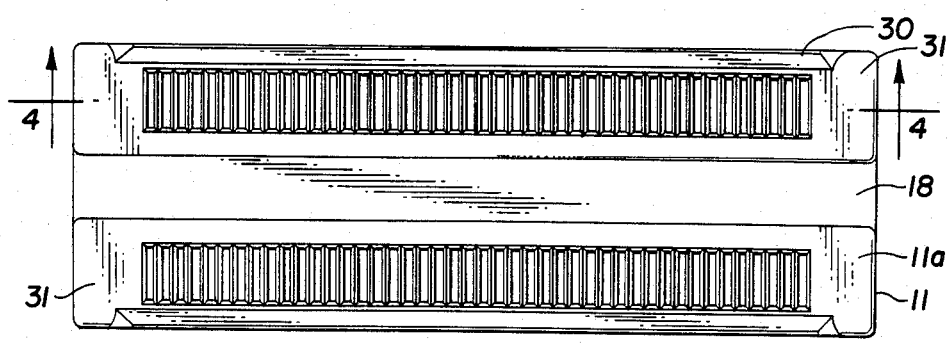
FIG. 1 is a top plan view of the preferred embodiment of the socket of the invention.
Figure 2:
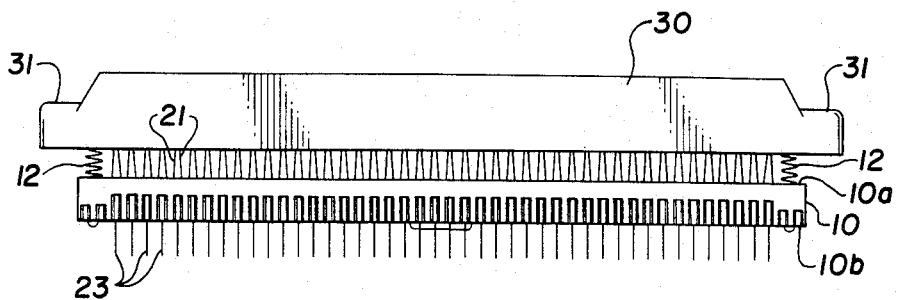
FIG. 2 is a side elevational view of the socket of FIG. 1.

As shown in the drawings, the preferred embodiment of the socket of the invention includes a base member 10 having oppositely disposed first and second major faces 10a and 10b, respectively, and a top plate 11 having oppositely disposed first and second major faces 11a and 11b, respectively. Second major face 11b of the top plate 11 is disposed substantially parallel with and spaced from first major face 10a of the base member 10. Base member 10 and top plate 11 are moveable with respect to each other in the vertical direction only as illustrated in the drawings. The socket may include, if desired, resilient means such as coil springs 12 or the like positioned between the opposed major faces to urge the top plate 11 away from the base 10 as will be discussed hereinafter. Furthermore, additional means (not illustrated), such as studs passing vertically through the top plate 11 and the base support 10 but secured to only one of the members may be employed to maintain the parts secured in their desired relationship while permitting relative vertical movement thereof, if desired.

Figure 6:
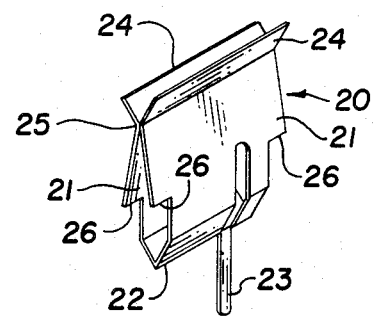
FIG. 6 is a perspective view of the preferred embodiment of the pin connector employed in the preferred embodiment of the invention.

The top plate 11 and base member 10 are made, of course, of rigid substantially electrically non-conductive material and support therein a plurality of electrically conductive pin connectors as illustrated at 20 in FIG. 6. The pin connectors are preferably formed by stamping or the like from sheets or strips of resilient electrically conductive metal or alloys such as beryllium copper and the like. As illustrated in FIG. 6 the pin connector is in the form of a substantially U-shaped body having a base 22 joining two sides 21 which extend substantially parallel in a first direction from the base 22 and a contact pin 23 extending in substantially the opposite direction from said base 22. The sides or legs 21 are formed to substantially converge near the ends thereof remote from the base 22 with the extreme ends of the sides 21 bent outwardly forming outwardly diverging lips 24, thereby forming contacting knees 25 parallel with the outer ends of the sides 21 and spaced slightly inward from the remote ends of the sides 21.

In the preferred embodiment of the invention the pin connectors 20 are formed pre-stressed so that in the normal relaxed position the knees 25 are urged together and firmly into contact with each other or at least very close to each other. This pre-stressing is, of course, necessary so that the leads which extend from the device package (not shown), when inserted between the knees 25, will be held in firm physical and electrical contact with the pin connector 20 by the resilient pre-stress on the legs 21.

Figure 3:
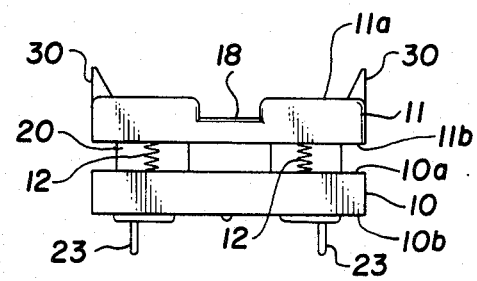
FIG. 3 is a end view thereof.
Figure 4:
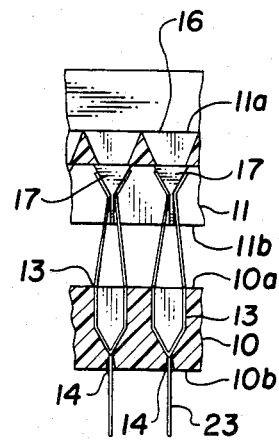
FIG. 4 is a sectional view of the socket of FIG. 1 taken through lines 4—4 showing the socket in the closed position.
Figure 5:
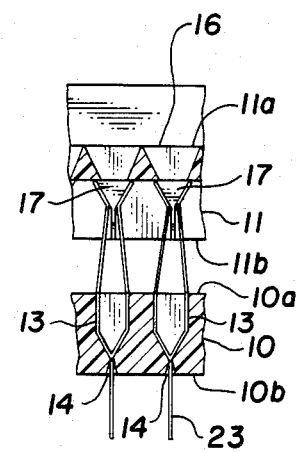
FIG. 5 is a sectional view of the socket of FIG. 1 taken through line 4—4 showing the socket in the open position.

In order to position and firmly secure the pin connector 20 within the socket, the sides 21 are preferably formed to be wider at the ends thereof remote from the base 22, thereby defining a shoulder 26. The base 22 of each pin connector 20 is then snugly fitted within a matching cavity 13 in the first major face of the base member 10 as shown in FIGS. 4 and 5. The shoulder 26 rests on the first major face 10a of the base member and contact pin 22 extends through an aperture 14 in the base of cavity 13. Ordinarily each socket contains two parallel rows of pin connectors as best illustrated in FIGS. 1 and 3. The sides 21 of the pin connector are, of course, much wider than necessary to mate with the leads of any particular DIP but are intentionally so made to accommodate various widths of DIPs.

In the preferred embodiment the pin connectors 20 are essentially symmetrical about the base 22 except that the contact pin is displaced to one side. Accordingly, the pin connectors can be arranged within the cavities 13 in the socket base member 10 in various arrangements to provide pins 23 only in two rows on the outboard sides of the socket (as shown in FIG. 3) or in various other arrangements to provide as many as four parallel rows of pins 23 by simply reversing the pin connectors as desired.

Operation of the socket of the invention will be best understood by referring to FIGS. 4 and 5. As illustrated therein, a plurality of pin connectors 20 are arranged in the cavities 13 and the top plate positioned thereover. The top plate 11 has a pair of elongated cavities therein aligned to receive the lips 24 on the upper ends of the pin connectors 20. An aperture 16 in the upper face 11a is aligned in register with the center of each pin connector 20 and elongated to coincide with the width of the ends of the pin connectors. A Y-shaped wedge 17 is formed on each side of the cavity directly below each aperture 16 so that when the device is assembled the tail of each Y-shaped wedge is inserted between the lips 24 of the pin connector 20 and grasped by the knees 25. Since the pin connectors are pre-stressed to the closed position, the entire assembly may be held together by the U-shaped pin connectors 20.

Since the base of the U is snugly fitted in cavity 13, spreading of the legs increases the frictional contact between the base member 10 and the pin connector 20. Thus the pin connectors 20 are firmly secured to the base member 10. Furthermore, with the tails of the Y-shaped wedges grasped between the knees 25, the top plate 11 is securely attached to the assembly. As stated above, springs 12 or the like may be used to urge the upper and lower components apart if desired. Likewise, bolts, pins or the like (not shown) may be utilized to maintain the top plate 11 secured to the base member 10.

It will be observed that in the assembly described the tails of the Y-shaped wedges 17 not only function to secure the device together but also slightly spread the knees 25 apart. The tail of the wedge 17, however, is slightly less than the width of the DIP lead. Accordingly, in order to insert the leads of the DIP into the socket, the top plate 11 is urged toward the base member 10. In so doing, the upper portion of the Y-shaped wedge is forced between the lips 24 to further spread the knees by flexing the sides of the U-shaped connectors. In this position, the leads of the DIP may be inserted directly into the socket. When the pressure urging the top plate 11 toward the base member 10 is released, the legs of the pin connectors 20 converge to force the top plate 11 and the base member apart by riding down the sloped edges of the wedges 17. As this occurs the leads of the DIP are firmly grasped between the opposed legs of the pin connector 20 at knees 25.

It will be observed that it is not necessary to open the pin connectors as described above to insert a DIP within the socket. Instead, since the knees 25 are held slightly apart by the tails of the Y-shaped wedges 17, the leads of the DIP may be merely inserted through the apertures 16 and the DIP fully inserted within the socket by pressing uniformly on the DIP. In this instance the leads are forced between the knees 25 and the knees 25 exert a wiping action on the leads to remove any oxidation, corrosion or the like. Thus a firm, secure electrical contact is formed between the knees 25 and the leads of the DIP. However, since the pin connectors 20 exert substantial force on the leads of the DIP, it may be necessary to mechanically spread the knees for easy removal of the DIP. This can be simply accomplished by pressing the top plate 11 toward the base member 10, thus spreading the knees 25 to release all the leads of the DIP simultanteously. The DIP may then be removed from the socket without exerting any pressure whatsoever on the leads. In fact, if the socket is inverted and opened as described above, the DIP may fall from the socket merely by gravity. It will thus be observed that the socket of the invention may be used either as a low insertion force socket or a zero insertion force socket.

From the foregoing it will be observed that the socket described readily lends itself to use in test apparatus such as burn-in boards and the like. Note that the only moveable part is the top plate 11 which moves vertically with respect to the base member 10. Such vertical movement is accomplished by flexing the sides of the U-shaped members. Accordingly, the socket device lends itself well to continuous reuse as it is not subject to mechanical failure. Furthermore, in the event that any of the pin connectors 20 should fail, it may be readily replaced by simply removing the top plate 11.

Thus the socket may be readily repaired if failure should occur.

It should be further noted that the pin connectors 20 are arranged in two parallel rows to receive the parallel rows of the pins extending from ordinary DIP packages. However, the rows are aligned and the pin connectors 20 are sufficiently wide to accommodate various different widths of DIP packages.

Referring again to FIG. 3, it will be noted that the top surface 11a of top plate 11 has a groove 18 centrally aligned between the two rows of apertures 16. Groove 18 is provided to permit multi-unit and automated insertion and removal of multiple DIPs by the use of placement and removal swords, rails and the like.

Top plate 11 may also be provided with upwardly extending walls 30 aligned parallel with and/or perpendicular to the length of the socket. Such walls may conveniently be used to accept mechanically or manually applied vertical force for operating the sockets. Similarily, the top plate 11 may include extension pads 31 to which vertical force may be applied. Since only vertical force in one direction is required to open the socket, and since the socket automatically closes upon release of the opening force, the socket is readily adaptable to use in connection with a wide variety of automated mechanical and hand operated loading and unloading systems.

It will be readily appreciated that the socket of the invention may be designed to accommodate DIPs of various sizes, pin counts, pin spacings and pin sizes. Furthermore, the principles of the invention are not limited to use in connection with DIPs. The arrangement of parts can be modified to accommodate other package configurations by appropriate relocation of the apertures and pin connectors. Therefore, while the invention has been described with particular reference to use in connection with DIPs, various other applications will become readily apparent. Accordingly, it is to be understood that although the invention has been described with particular reference to specific embodiments thereof, the forms of the invention shown and described in detail are to be taken as preferred embodiments of same, and that various changes and modifications may be resorted to without departing from the spirit and scope of the invention as defined by the appended claims.

What is claimed is:

1. A receptacle for a device package having a plurality of pins extending substantially parallel with each other in a first direction from said package comprising:
    (a) a plurality of substantially U-shaped pin connectors constructed of resilient electrically conductive material, each of said pin connectors having two opposed sides extending in a first general direction from the base of the U and a contact pin extending in substantially the opposite direction from the base of the U with the sides of the U converging toward each other near the ends thereof remote from the base of the U and at least the end of one side of each U-shaped pin connector diverging outwardly from the opposite side of the U-shaped pin connector to define a contact knee inward from the end of the pin connector remote from the base of the U;
    (b) a substantially electrically insulating base member with first and second oppositely disposed major faces and a plurality of cavities in said first major face adapted to receive the bases of said U-shaped pin connectors and with apertures for receiving the contact pins so that the contact pins extend from said second major face of said base member; and
    (c) a top plate member with first and second oppositely disposed major faces mounted with its second major face substantially parallel with and spaced from the first major face of said base member, said second major face of said top plate member having at least one cavity therein adapted to receive the ends of said sides of at least one pin connector, an aperture passing through said top plate member aligned and in register with said ends of said at least one pin connector, and wedge means disposed on at least one side of said cavity and arranged for insertion between the two opposed sides of said at least one pin connector to spread the sides of said at least one pin connector apart at the ends thereof remote from the base when said top plate member is moved toward said base member.

2. A receptacle as defined in claim 1 wherein said wedge means is a substantially Y-shaped body with the tail of said Y-shaped body disposed between the opposite sides of said at least one pin connector holding said contact knee slightly spread from the opposite side of said at least one pin connector.

3. A receptacle as defined in claim 1 including substantially vertical walls extending from said first major face of said top plate member.

4. A receptacle as defined in claim 2 wherein said top plate member is secured to said U-shaped pin connectors by the contact knees of the pin connectors grasping the tails of the Y-shaped bodies.

5. A receptacle as defined in claim 1 wherein each said pin connector is secured to said base member by friction between the pin connectors and the walls of the cavities in said first major face of said base member.

6. A receptacle as defined in claim 1 including stud means joining said top plate member and said base member but permitting relative vertical movement therebetween.

7. A receptacle as defined in claim 1 including spring means for urging said second major face of said top plate member from said first major face of said base member.

8. A receptacle as defined in claim 1 including two spaced apart parallel rows of substantially U-shaped pin connectors.

9. A receptacle as defined in claim 8 including a groove in said first major face of said top plate member positioned intermediate said two spaced apart parallel rows.

10. A receptacle as defined in claim 1 wherein the contact pin extending from the base of each U-shaped pin connector is displaced from the center of the U.

* * * * *

UNITED STATES PATENT AND TRADEMARK OFFICE
CERTIFICATE OF CORRECTION

PATENT NO. : 4,618,199
DATED : October 21, 1986
INVENTOR(S) : Wayne K. Pfaff

It is certified that error appears in the above-identified patent and that said Letters Patent is hereby corrected as shown below:

In Column 2, line 15, after "low" insert ---and---

Signed and Sealed this

Seventeenth Day of February, 1987

*Attest:*

DONALD J. QUIGG

*Attesting Officer*  *Commissioner of Patents and Trademarks*